US007022542B2

(12) United States Patent
Combi et al.

(10) Patent No.: US 7,022,542 B2
(45) Date of Patent: Apr. 4, 2006

(54) MANUFACTURING METHOD OF A MICROELECTROMECHANICAL SWITCH

(75) Inventors: Chantal Combi, Oggiono (IT); Benedetto Vigna, Potenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 101 days.

(21) Appl. No.: 10/746,868

(22) Filed: Dec. 24, 2003

(65) Prior Publication Data

US 2004/0157364 A1 Aug. 12, 2004

(30) Foreign Application Priority Data

Dec. 24, 2002 (IT) .......................... MI2002A2769

(51) Int. Cl.
*H01L 21/00* (2006.01)

(52) U.S. Cl. ............................. 438/52; 438/50; 438/48

(58) Field of Classification Search .................. 438/50, 438/52, 48; 200/181
See application file for complete search history.

(56) References Cited

U.S. PATENT DOCUMENTS 5,638,946 A 6/1997 Zavracky .................... 200/181
6,872,902 B1 * 3/2005 Cohn et al. ................. 200/181
6,903,637 B1 * 6/2005 Miyazaki et al. ............. 335/78

* cited by examiner

*Primary Examiner*—Bradley K. Smith
(74) *Attorney, Agent, or Firm*—Lisa K. Jorgenson; Allen, Dyer, Doppelt, Milbrath & Gilchrist, P.A.

(57) ABSTRACT

The method for manufacturing a micromechanical switch includes manufacturing a hanging bar, on a first semiconductor substrate, equipped at an end thereof with a contact electrode, and a frame projecting from the first semiconductor substrate. A second semiconductor substrate with conductive tracks includes a second input/output electrode and a third starting electrode, and first and second spacers electrically connected to the conductive tracks. The frame is abutted with the first spacers so that the fourth contact electrode abuts on the second input/output electrode in response to an electrical signal provided to the hanging bar by the third starting electrode.

10 Claims, 9 Drawing Sheets

MANUFACTURING METHOD OF A MICROELECTROMECHANICAL SWITCH

FIELD OF THE INVENTION

The present invention relates to the field of microelectromechanical devices and manufacturing methods thereof.

BACKGROUND OF THE INVENTION

As it is well known, the demand for switches having high performances in terms of insulation and insertion loss has pushed the search for new technological and design approaches. In particular, MEMS (Micro Electro-Mechanical System) switches dissipate little power thus obtaining a considerable energy consumption savings. Further, MEMS switches have a high linearity on the whole frequency band, avoiding signal distortion phenomena, and they have a high Insertion Loss, i.e. a low signal attenuation. Moreover, these devices can be manufactured on silicon substrates thus offering an integration possibility with other electronic components integrated in a traditional way or in more complex systems.

A first known technical approach to manufacture a switch operated in an electrostatic way and manufactured with a micromachining technique is described in U.S. Pat. No. 5,638,946. This switch 1, as shown in FIG. 1, is manufactured by using a dielectric connection bridge P insulating the overhanging bar SS and leading the electrical contact. Although advantageous in several aspects, this first approach has several drawbacks. Because of the high number of cycles to be supported by the hanging bar, made of a metal or dielectric material, this approach is thus not very reliable.

A second approach provides instead the use of a switch operated in an electrostatic way, manufactured via a surface micromachining technique involving the use of two wafers for manufacturing the metal contact. One wafer is dedicated to manufacturing the balancing structure and the other wafer to manufacturing transmission lines. The removal of the wafer allowing the mobile structure to be manufactured is required to release the switch movement for which this wafer does not serve as part of the integrated package. The distance between the balancing mobile structure and the contact electrode is given by gold spacers. This approach also has some drawbacks. Gold spacers have the disadvantage of having a variable thickness with the pressure needed to assemble the two wafers for which high operating voltage variations occur.

In a third known approach, a switch, as shown in FIG. 2, manufactured on a gallium arsenide substrate AG, operated in an electrostatic way, comprises a silicon bar S covered with aluminum and with a platinum-on-gold metal contact C. The disadvantage of this structure is the use of a metal like platinum for the contact having a relatively high resistivity with respect to gold or copper (less than 2 mWcm).

FIG. 3 shows a magnetically operated switch IM, comprising a bar S1 whereon a magnet M and known starting electrodes A are located. The disadvantage is that the required structures for creating the magnetic field weigh down the overall switch structure. Moreover some interference could arise with the radio frequency signal passing through the contact C1.

A further approach provides the manufacture of a switch operated in an electrostatic way manufactured by using two hanging bars, manufactured during the same process step, and arched upwards with respect to the supporting substrate plane. One hanging bar serves as a contact and the other serves for the contact latch. By operating the second bar the contact is locked as between the gears of watch rollers. The disadvantage is due to the bending and relative height of the two bars that highly depend on the technological process conditions.

SUMMARY OF THE INVENTION

An object of the present invention is to provide a manufacturing process of a microelectromechanical switch having such structural and functional features as to allow a higher reliability overcoming the limits and drawbacks still affecting prior art devices.

Another object of the present invention is to manufacture a contact microelectromechanical SPST (Single Pole Single Through) series switch, operated in an electrostatic way at low voltage, manufactured via a process using a first substrate on which the real switch is integrated and a second substrate wherein all radio frequency components are integrated, and wherein these two substrates are tightly assembled to each other. Advantageously, electrical connections with the outside are formed via throughways in the substrate.

The method for manufacturing a micromechanical switch includes manufacturing a hanging bar, on a first semiconductor substrate, equipped at an end thereof with a contact electrode and a frame projecting from the first semiconductor substrate. A second semiconductor substrate with conductive tracks includes a second input/output electrode and a third starting electrode, and first and second spacers electrically connected to the conductive tracks. The frame is abutted with the first spacers so that the fourth contact electrode abuts on the second input/output electrode in response to an electrical signal provided to the hanging bar by the third starting electrode.

The features and advantages of the device according to the invention will be apparent from the following description of an embodiment thereof given by way of non-limiting example with reference to the attached drawings.

DETAILED DESCRIPTION OF THE PREFERRED EMBODIMENTS

Figure 5:
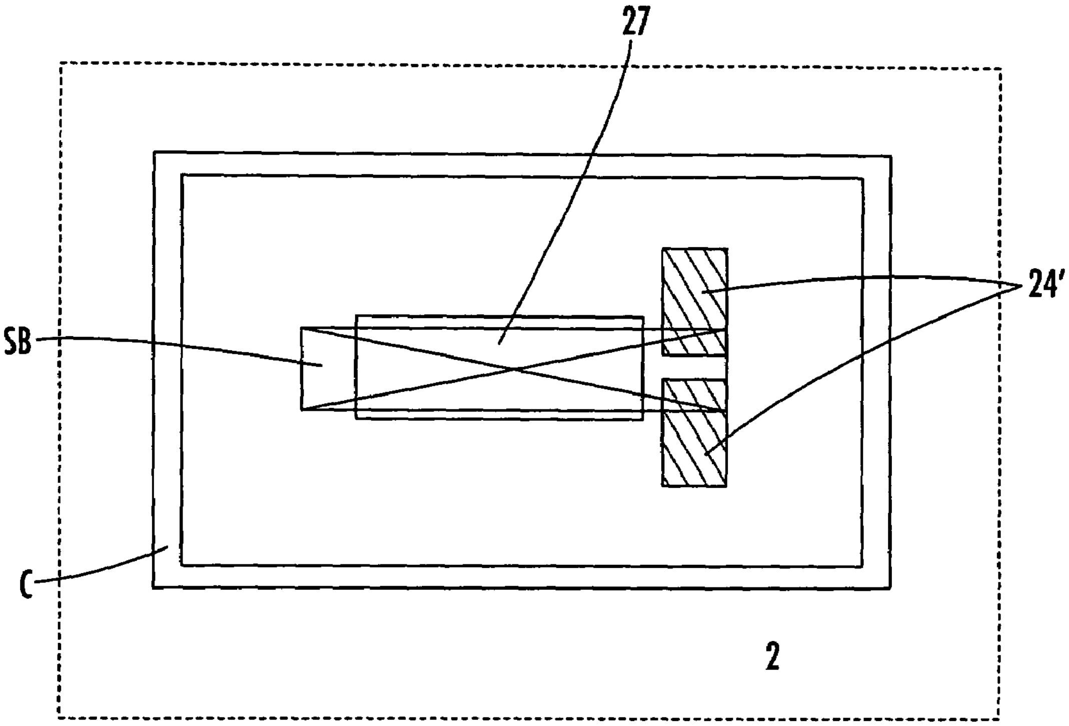
FIG. 5 is a schematic view from above of the microelectromechanical switch of FIG. 4.
Figure 6:
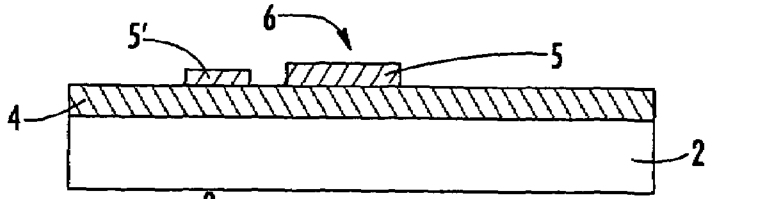
FIGS. 6 to 19 are schematic sectional views of the microelectromechanical switch of FIG. 4 during the manufacturing method according to the invention.
Figure 7:
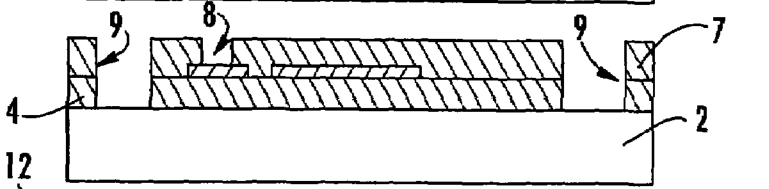
Figure 8:
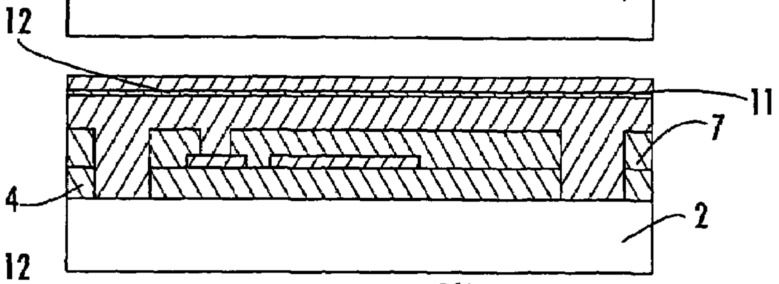
Figure 9:
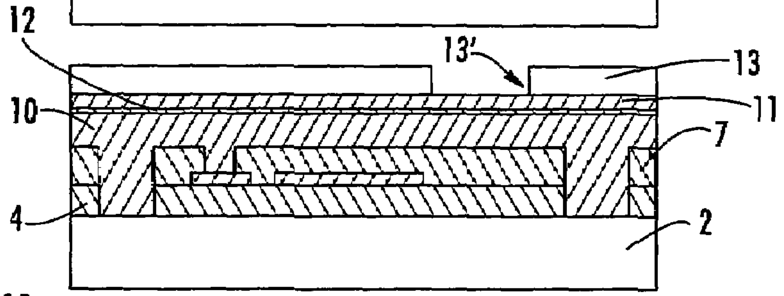
Figure 10:
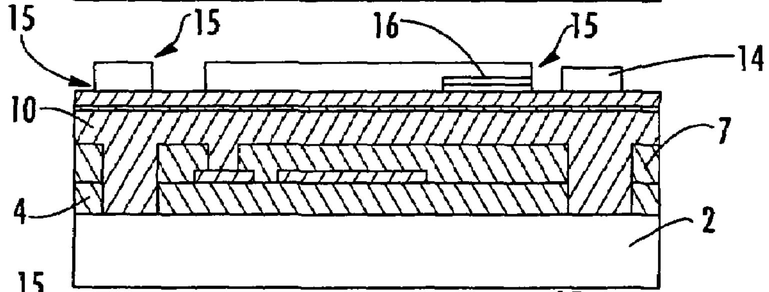
Figure 11:
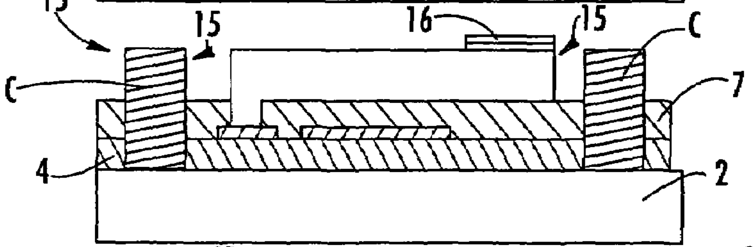
Figure 12:
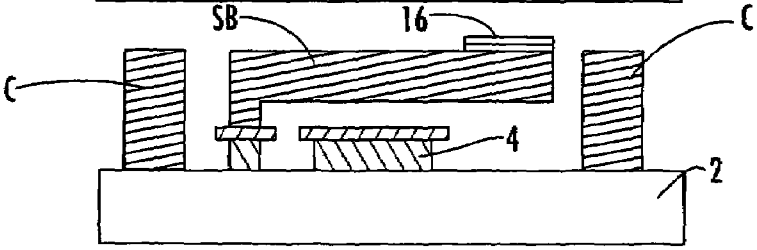
Figure 13:
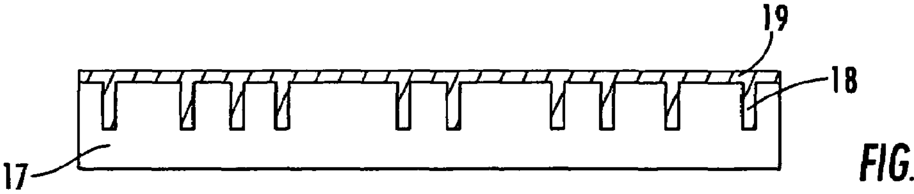
Figure 14:
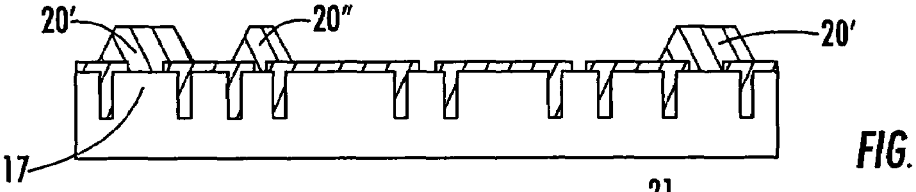
Figure 15:
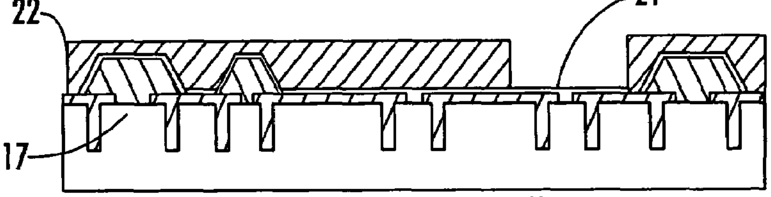
Figure 16:
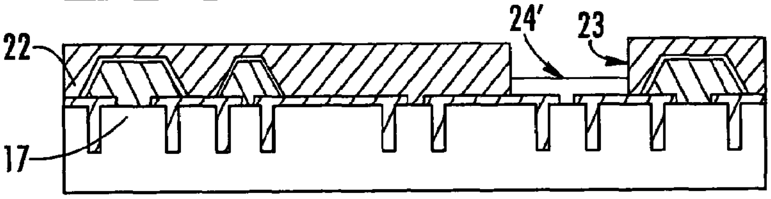
Figure 17:
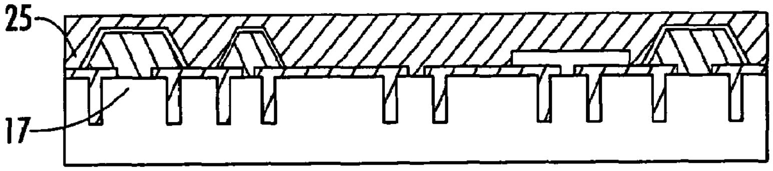
Figure 18:
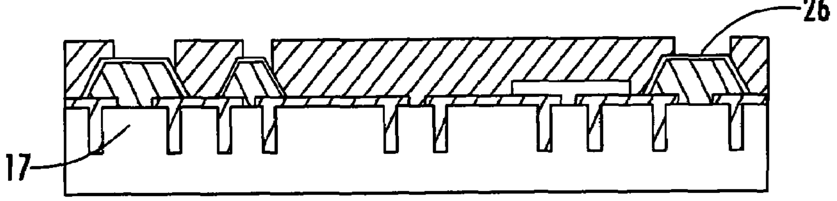
Figure 19:
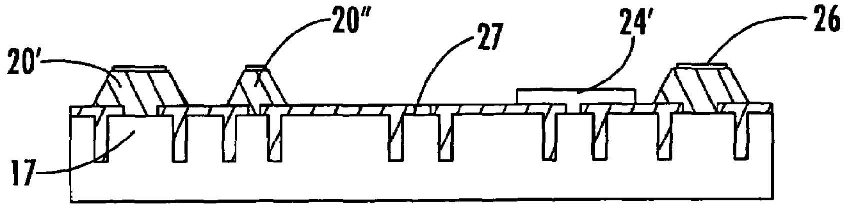

The invention relates particularly, but not exclusively, to a manufacturing method of an ohmic switch, i.e. a switch completing the signal path by short-circuiting transmission lines, otherwise interrupted, and the following description is made with reference to this field of application for convenience of illustration only. With reference to the drawings, a method for manufacturing on a semiconductor an ohmic microelectromechanical switch 1 is described, being operated in an electrostatic way in a shunt configuration as shown in FIG. 5.

Figure 1:
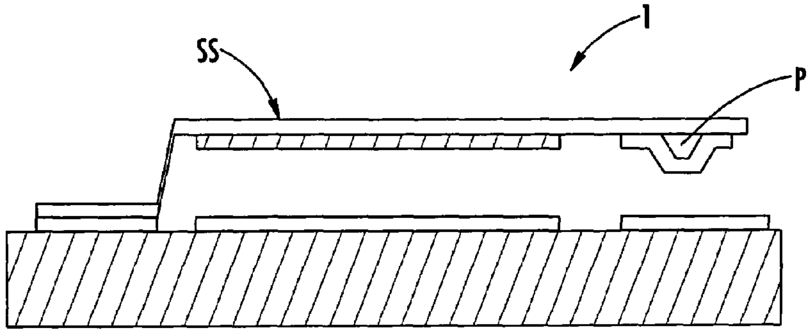
FIG. 1 (PRIOR ART)
FIGS. 1 to 3 are schematic diagrams showing three different embodiments of microelectromechanical switches manufactured according to the prior art.
Figure 2:
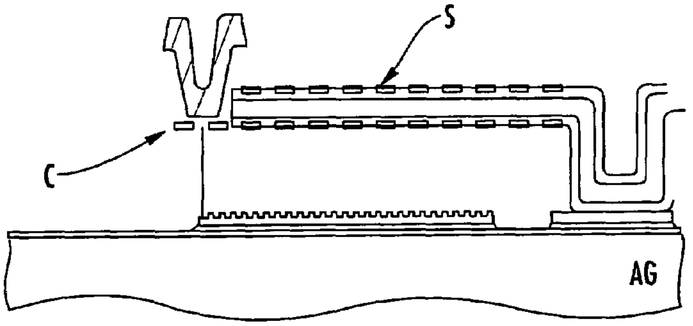
FIG. 2 (PRIOR ART)
Figure 3:
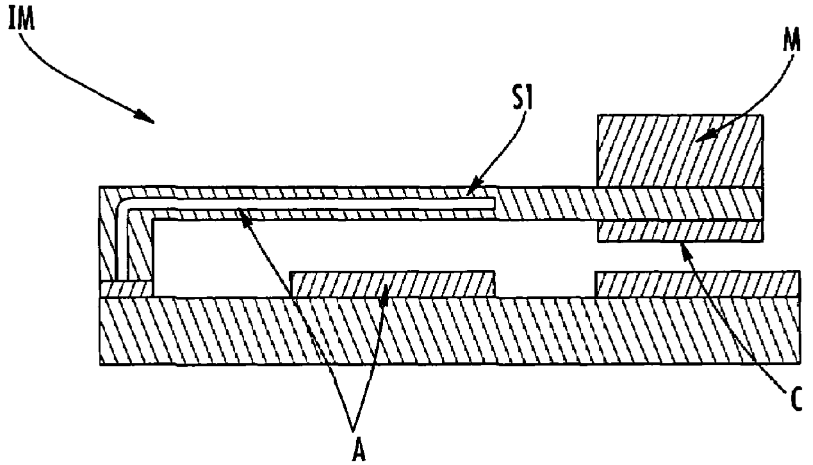
FIG. 3 (PRIOR ART)
Figure 4:
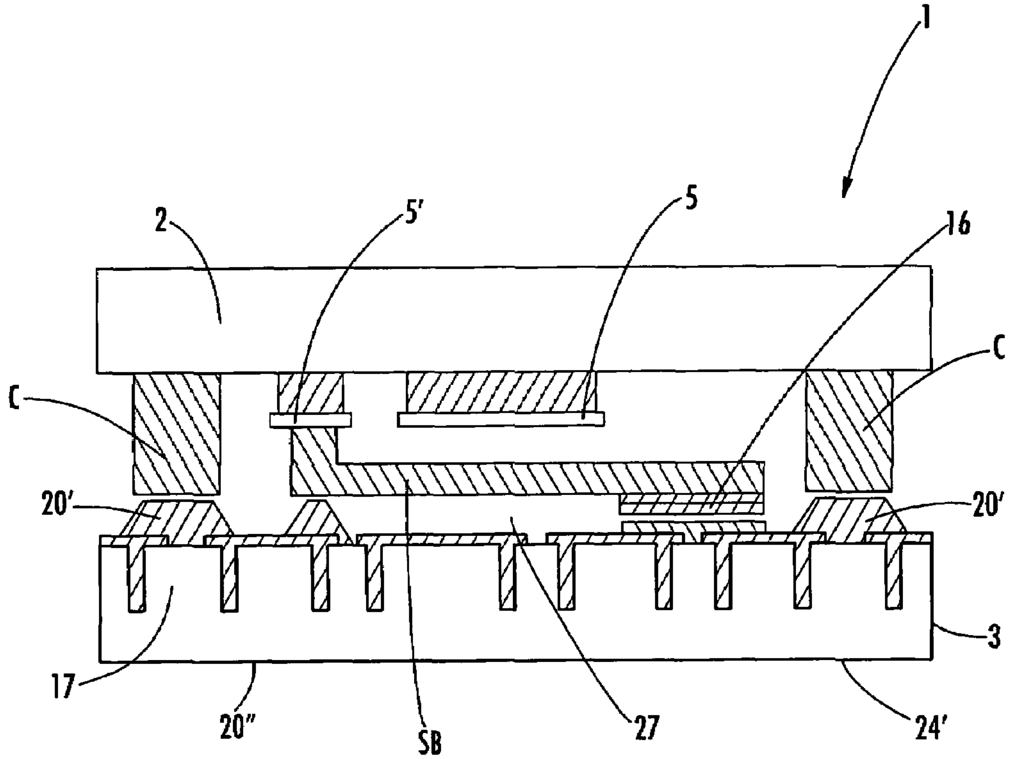
FIG. 4 is a schematic sectional view of a first embodiment of a microelectromechanical switch manufactured with the method according to the invention.

In particular, with reference to FIG. 4, a microelectromechanical switch 1 is described, being integrated on a first substrate 3, called the HANDLE wafer, comprising a first starting electrode 27 and a second input/output electrode 24' manufactured on this first substrate 3. The input/output electrode 24' comprises two portions Rfin and Rfout as shown in FIG. 5 and it is connected to a transmission line of the signal to be interrupted.

Spacers 20 are also manufactured on this first substrate 3. In particular, a first central spacer 20' and second peripheral spacers 20" are manufactured, defining a frame near the peripheral area of the substrate 2. Advantageously, these electrodes 24', 27 and these spacers 20 are connected to conductive tracks 17 manufactured through the substrate 3 to provided for the electrical contact of these electrodes and spacers with the device outside.

The microelectromechanical switch 1 according to the invention comprises a second substrate 2, the DEVICE wafer, from which a L-shaped bar SB overhangs, a frame C and advantageously a return electrode 5. The short section of the L shape extends perpendicularly to the substrate 2, while the long section extends in a parallel way to the substrate 2. The bar SB has an end thereof connected to the second substrate 2 while the other free end is provided with a contact electrode 16 which is electrically coupled to the input/output electrode 24'.

In correspondence with the bend of the L shape thereof, the bar SB abuts against a first central spacer 20" manufactured on the first substrate 3. Therefore the bar SB has a support point on the spacer 20" and it is free to fluctuate between the two substrates. The frame C abuts against second peripheral spacers 20'. The frame C completely surrounds the hanging bar SB as shown in FIG. 5.

During the operation, the switch starting electrode allows the bar SB to contact the contact electrode 16 and the input/output electrode 24' to short-circuit the signal transmission line. To optimize the switch operation, it is convenient that the starting electrode 27 and the input/output electrode 24' connected to the signal transmission are electrically uncoupled. The element used with high frequencies to accomplish the uncoupling is a capacitor connected in series with a resistor.

Advantageously, substrates 2, 3 have a high resistivity, for example 3–20 kΩcm, to remove the parasitic effects of the currents induced by electromagnetic fields (Foucault currents). According to the invention, the second wafer or substrate 3 has a triple function: supporting switch contacts and transmission lines; protecting during and after the substrate wafer cutting; and electrically connecting the switch and the printed board. The frame C serves as support for the assembly material of the two wafers, and to space the wafers between them in the assembly step, as well as to accomplish a tight assembly like the edges of a pair of half-shells.

The manufacturing process of the switch according to the invention is now described starting from the first semiconductor substrate 2 called the DEVICE wafer. In particular with reference to FIGS. 6 to 12, a semiconductor substrate 2 is described, for example of highly resistive silicon, whereon a first insulating layer 4 is formed to achieve the device electrostatic insulation. This insulating layer 4 is for example an oxide layer formed through an oven oxidation step. The thickness of this first insulating layer 4 is between 2 and 20 μm. In particular, the thicker this layer 4, the less the final device will suffer from the stray capacitance effects.

A conductive layer 6 is then formed on this insulating layer 4. A first anchor pad 5' is then manufactured through traditional photolithographic techniques and following etching step, which will be used as anchor support of the hanging structure represented by the bar SB, as well as advantageously a return electrode 5 of the switch 1, required in case of contact micromelting. This conductive layer 6 is, for example, a polysilicon layer formed through low pressure deposition. Since no low resistivity demands arise because switches are voltage-driven, the thickness of the polysilicon conductive layer 6 is advantageously a few hundred nanometers. Therefore too articulated topographies are also avoided.

A sacrificial insulating layer 7, for example, with a thickness of 1–2 μm is then deposited on the whole device to manufacture a hanging and balancing structure. This sacrificial insulating layer 7 is formed through a plasma deposition step. This sacrificial insulating layer 7 is for example a silicon dioxide layer.

A masking step and a further removal of the insulating layer 7 through plasma etching occur to form first openings 8 in correspondence with the first pad 5'. Second openings 9 are formed through this etching step by cascade-removing the sacrificial insulating layer 7 and the underlying sacrificial insulating layer 4, to manufacture thus the contact with the substrate 2 which must be grounded, i.e. connected to ground, to optimize the radio frequency device operation. These second openings 9 form a frame dug in the peripheral area of the substrate 2. Advantageously, the definition of the latter two openings 8, 9 is also performed with two different masking steps.

A further conductive layer 10 is then formed on the insulating layer 7 and in openings 8, 9 to manufacture the hanging bar SB of the switch 1, serving as second electrode for electrostatic operation. Also the future frame C is defined in this way. Advantageously, the conductive layer 10 is an epitaxial polysilicon layer. To grow the epitaxial polysilicon layer 10 a preceding deposition of a layer serving as a seed layer for the polysilicon growth in the epitaxial reactor is provided. Advantageously, the silicon is used as structural conductive layer 10 for its optimum mechanical properties ensuring a high reliability and fracture strength. Moreover, this material is a conductive material to exploit the electrostatic attraction during operation of the device. It is not necessary for the polysilicon layer to be doped.

Advantageously, to have a good adhesion between the following layers of deposited material, a mechanical and chemical milling is performed on the surface of the epitaxial polysilicon layer 10 reaching the thickness of about 2–4 μm. Since, as already mentioned, the switch 1 must have a good insulation between the operation part and the signal transmission part, a plasma deposition of a dielectric layer 11 on the conductive layer 10 is performed. Advantageously, this dielectric layer 11 is a silicon nitride layer or a dioxide plus silicon nitride layer, with a thickness of a few hundred nanometers.

A formation step of a high conductivity metal layer 12 is performed on this layer 11. Advantageously, the formation step of this metal layer 12 is performed by an evaporation or a sputtering deposition step. The metal being used is a gold alloy, for example gold-nickel to have a good mechanical resistance and melting strength.

A mask 13 is then manufactured, equipped with a third opening 13', on the metal layer 11 to define a contact electrode 16. The metal layer 12 and the dielectric layer 11 outside the opening 13' are cascade-removed. In particular, the metal layer 12 is removed by wet etching, while the dielectric layer 11 is removed by plasma etching.

A conductive layer 14 is formed on the whole device. Advantageously the conductive layer 14 is of the same material as the conductive layer 10. Through a traditional masking and etching step four openings 15 are defined in the conductive layer 14 and in the conductive layer 10 up to expose the layer 7 to complete the geometry of the hanging bar SB of the switch and of the frame C being manufactured around the switch 1. This etching step is performed by a plasma anisotropic etching. Finally the hanging bar SB is released through a vapor etching of the sacrificial silicon dioxide layer 7 and of the layer 4 being uncovered by the contact electrode 5 and by the anchor pad 5'.

With reference to FIGS. 13 to 19, the process steps to manufacture a substrate 3 called the HANDLE are described hereafter. Highly doped conductive tracks 17 are manufactured on a highly resistive silicon substrate 3, for example 3–20 kΩcm. For example, each conductive track 17 is manufactured by a cylindrical portion of the substrate 3 being laterally surrounded by a trench 18 manufactured in the substrate 3 to insulate it from the remainder substrate 3. An embodiment of conductive tracks 17 is described in the European patent application no. 1151962 by the same Applicant. The trench 18 depth is, for example, 100 μm. Trenches 18 are then oxidized to have electrically insulated conductive tracks 17.

A dielectric layer 19 is formed on the so-prepared substrate 3. For example a low pressure silicon dioxide layer 19 is deposited, to have electrical insulation between the electrodes to be implemented for controlling the switch and for transmission lines. The 2–3 μm-thick silicon dioxide layer 19 is masked and removed in correspondence with the conductive tracks 17 of the frame C and with the bar anchor pad 5'. In this case conductive tracks 17 are used to ground the substrate 3 and to bias the switch 1.

At this point spacers 20 are manufactured. First peripheral spacers 20', defining a frame near the peripheral area of the substrate 3, are manufactured to abut against the frame C, while a second central insulated spacer 20" is manufactured to abut against the hanging bar SB. Advantageously, these spacers 20 are made of epitaxial polysilicon or aluminum. To this purpose a polysilicon seed layer is deposited at low pressure to grow an epitaxial polysilicon layer to manufacture spacers 20. The epitaxial polysilicon layer surface is milled again to have a very smooth surface and the geometry of spacers 20 is defined through masking.

Advantageously an anisotropic plasma etching is used according to a 70° slant, to avoid sharp angles that may cause problems in the continuity of the layers deposited afterwards. Advantageously, an epitaxial silicon layer is used to manufacture spacers 20 since it is not deformed during the assembly step and the operation distance is thus well known. In this case too the silicon may not be doped since there is no demand for low resistance.

At this point the dioxide layer 19 is etched in correspondence with conductive tracks 17 wherein a starting or control electrode and the electrodes connected to transmission lines will be manufactured. A conductive layer 21 is then formed on the whole device to manufacture a starting electrode. This conductive layer 21 is formed by an evaporation or sputtering of a metal like titanium-gold or chrome-gold or titanium and palladium. Advantageously, the thickness is a few tens of nanometers. This conductive layer 21 also serves as galvanic growth seed layer for a metal layer for contacting and for adhering together the two substrate wafers 2, 3.

A thick resist layer 22 is then deposited, which is removed to form an opening 23. A further metal layer 24 is then formed in the opening 23 to manufacture an input/output electrode 24' with transmission lines. Advantageously, this metal layer 24 is formed by gold galvanic growth. In particular, via electric current a predetermined thickness of the metal layer 24 is deposited. For example the grown layer 24 is gold-nickel.

A further thick resist layer 25 is then deposited in correspondence with spacers 20. A further metal layer 26 is then formed. Advantageously this metal layer is formed by gold galvanic growth. This metal layer 26, after being put into contact with the DEVICE wafer frame C, forms a conductive and sealing binder. Once the resist 25 is removed, the masking is finally performed to define the geometry of the metal layer 21 to manufacture a starting electrode 27, for example, by wet etching. Advantageously, by using only a metal layer 21 for the starting electrode 27, short-circuits between the hanging bar and the electrode 27 itself are avoided. Advantageously, spacers 20 are made of evaporated aluminum to avoid reliability problems of the seed layer for gold growth for the switch electrical contact, and moreover, a well controllable thickness is obtained since aluminum is a very easy material to work.

Figure 20:
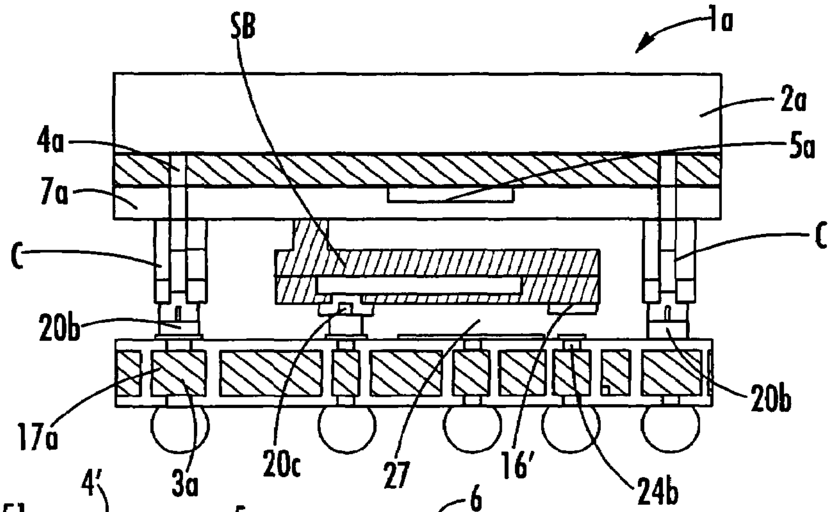
FIG. 20 is a schematic sectional view of a second embodiment of a microelectromechanical switch manufactured with the method according to the invention.
Figure 21:
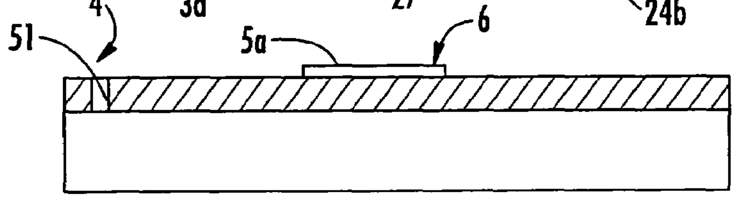
FIGS. 21 to 32 are schematic sectional views of the microelectromechanical switch of FIG. 20 during the manufacturing method according to the invention.
Figure 22:
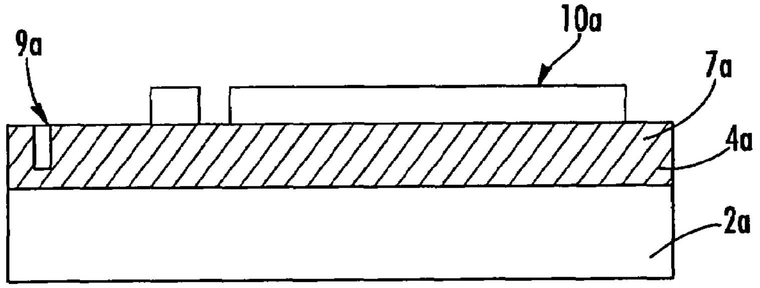
Figure 23:
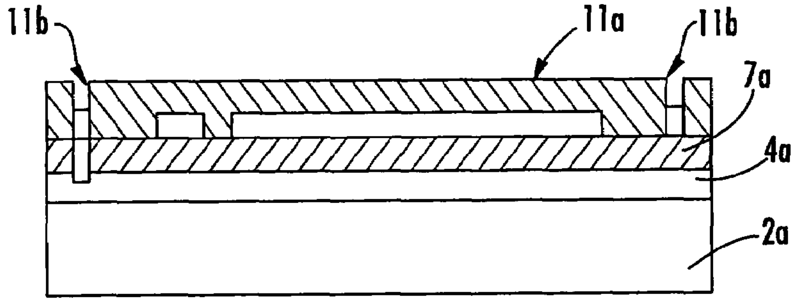
Figure 24:
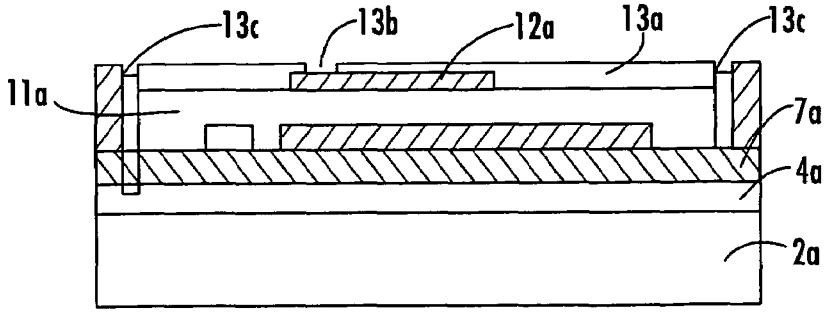
Figure 25:
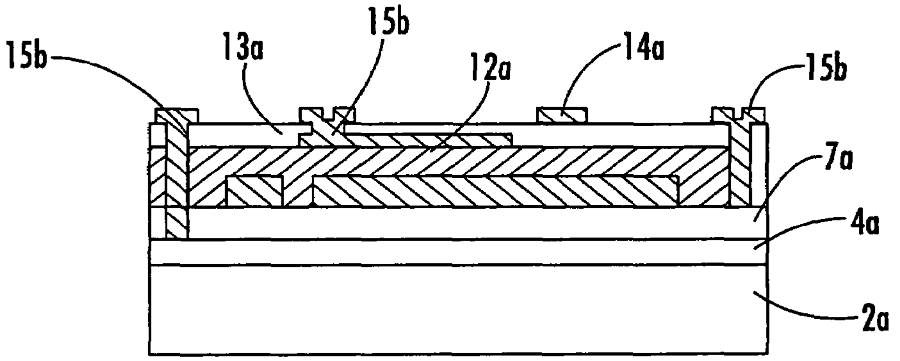
Figure 26:
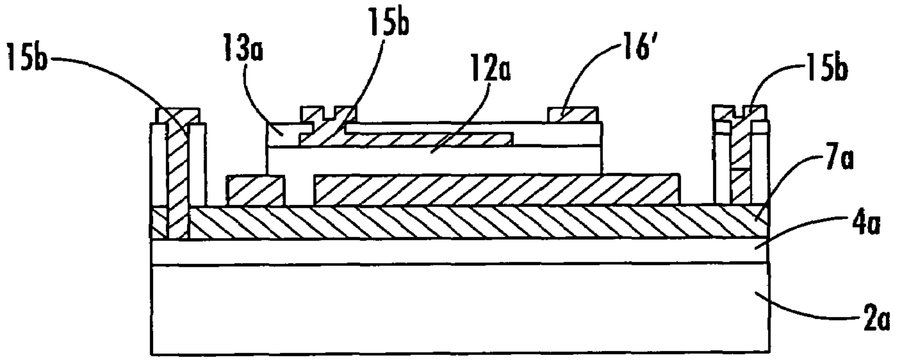
Figure 27:
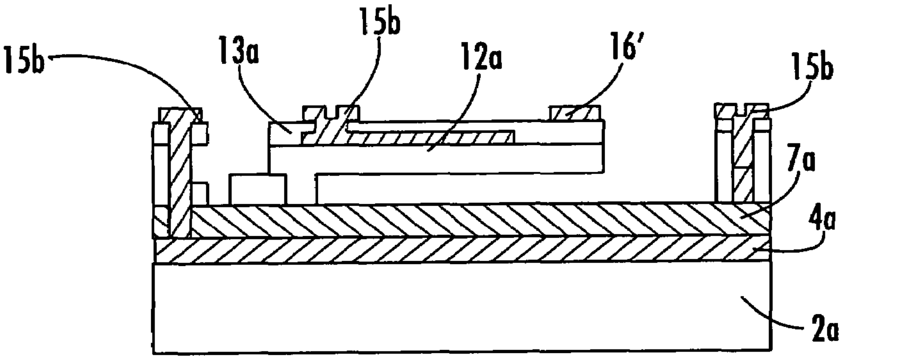

With reference to FIG. 20, a second embodiment of the microelectromechanical switch 1*a* integrated on a first substrate 3*a*, called the HANDLE wafer, is described. This substrate 3*a* comprises a first starting electrode 27*a* and a second input/output electrode 24*b*. The input/output electrode 24*b* comprises two portions Rfin and Rfout being respectively connected to a transmission line of the signal to be interrupted.

Spacers 20*a* are also manufactured on this first substrate 3*a*. In particular, a first central spacer 20*c* and second peripheral spacers 20*b* are manufactured, the latter defining a frame near the peripheral area of the substrate 3*a*. Advantageously, these electrodes 24*b*, 27*b* and these spacers 20*a* are connected to conductive tracks 17*a* defined in the substrate 3*a* to manufacture the electrical contact of these electrodes and spacers with the outside. The microelectromechanical switch 1*a* according to the invention comprises a second substrate 2*a*, the DEVICE wafer, an L-shaped bar SB projecting therefrom, and a frame C. Advantageously, a return electrode 5*a* is also manufactured on the substrate 2*a*.

The short section of the L shape extends perpendicularly to the substrate 2, while the long section extends in a parallel way to the substrate 2. The bar SB has an end thereof connected to the second substrate 2 while the other free end is provided with a contact electrode 16' which is electrically coupled to the input/output electrode 24*b*. In correspondence with the bend of the L shape thereof, the bar SB abuts against a first central spacer 20*c* manufactured on the first substrate 3*a*. Therefore the bar SB has a support point on the spacer 20*c* and it is free to fluctuate between the two substrates. The frame C abuts against the peripheral spacers 20*b*.

The operation of this switch 1*a* is the same as the switch 1 manufactured with the first embodiment. In this alternative embodiment the switch 1*a* comprises a hanging bar SB manufactured by combining an insulating material like silicon dioxide for example and a conductive layer like aluminum, for example, while an aluminum layer is used as a sacrificial layer. The protection frame C is manufactured with a conductive layer, for example a metal layer coated with an insulating layer, for example an oxide layer to ensure the electrical connection between the two wafers. The final device 1*a* may be obtained by welding the two highly resistive silicon substrates 2, 3, with gold and tin.

With reference to FIGS. 21 to 28 a second alternative embodiment of the process according to the invention is described. A first insulating layer 4*a* is formed on a semiconductor substrate 2*a*, for example of highly resistive silicon, to achieve the device electrostatic insulation. This insulating layer 4*a* is, for example, an oxide layer which is formed through a first oven oxidation step. The thickness of this first insulating layer 4*a* is between 2 and 20 μm.

An opening 4' is formed in the insulating layer 4*a* to manufacture an electrical contact. A conductive layer 6*a* is then formed on this insulating layer 4*a*. A return electrode 5*a* of the switch 1*a*, required in case of contact micromelting, is manufactured through traditional photolithographic techniques and a following etching step, as well as a plug 51 in the opening 4' to manufacture the electric contact and pads, not shown in the figures, which will be used as anchor support of the hanging structure. This conductive layer 6*a* is, for example, a polysilicon layer formed through low pressure deposition. Since no low resistivity demands arise because switches are voltage-driven, the thickness of the polysilicon conductive layer 6*a* is advantageously of a few hundred nanometers. Therefore too articulated topographies are also avoided.

A sacrificial insulating layer 7*a* for example with a thickness of 1–2 μm is then deposited on the whole device to manufacture a hanging and balancing structure. This sacrificial insulating layer 7*a* is formed through a plasma deposition step. This sacrificial insulating layer 7*a* is for example a silicon dioxide layer. A masking step and a further removal of the insulating layer 7*a* through plasma etching occur to form an opening 9*a* corresponding with outer contacts. A sacrificial metal layer 10*a* with a thickness of about 1 or 2 microns is then formed on the whole device. Advantageously, the sacrificial metal layer 10*a* is an aluminum layer being deposited through evaporation. A predetermined geometry is defined in the layer 10*a* through traditional photolithographic techniques and a following etching step to manufacture a hanging structure of the switch 1*a*.

From now on structural layers 11*a*, 12*a*, 13*a* are cascade-formed to manufacture a hanging bar SB of the switch 1*a*. For example, a third dielectric layer 11*a* is deposited, in particular plasma silicon dioxide. Second openings 11*a* are formed through traditional photolithographic techniques and a following etching step, which open a frame dug in the peripheral area of the substrate 2 and in correspondence with outer contacts for a protection frame C. A second metal layer 12 with a thickness of 100 or 200 nanometers is then formed to manufacture a second electrode for electrostatic operation.

The second metal layer 12*a* is formed by evaporating an aluminum layer. For example, a fourth dielectric layer 13*a*, particularly plasma silicon dioxide, is deposited. First openings 13*b* are formed through traditional photolithographic technique and a following etching step in correspondence with the structural aluminum layer 12*a* and second openings 13*c* are formed in correspondence with the openings 11*b* formed in the layer 11*a*. These openings 13*b* are used to manufacture a contact 15*a* being required to electrically bias the bar and then to perform the electrostatic operation and to bias the substrate 2*a*.

A metal layer 14*a* is formed on the dielectric layer 13*a* to manufacture a contact electrode 16'. This contact electrode 16' is, for example, made of gold through an evaporation or sputtering process. The contact electrode 16' is manufactured not to be overlapped on the structural aluminum layer 12*a*, to avoid or minimize any capacitive coupling. Openings 13*b*, 13*c* are filled in with a metal layer to manufacture contacts 15*a* near the frame C and to bias the layer 12*a*. Contacts 15*a* are advantageously made of titanium or palladium by sputtering being used as welding layer between the two wafers 2, 3.

Figure 28:
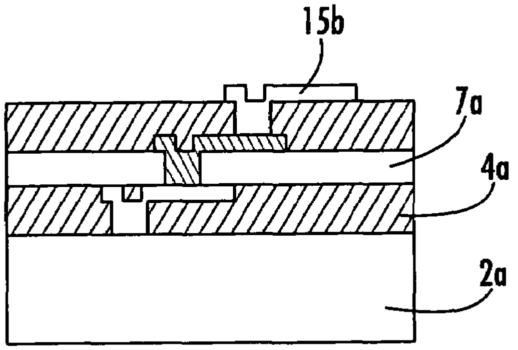
Figure 29:
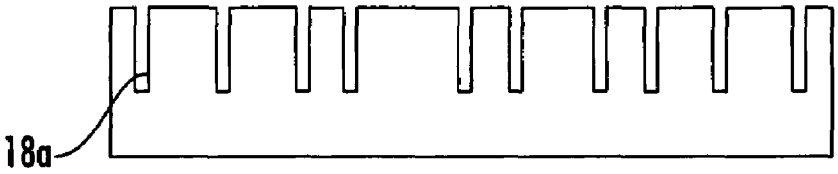
Figure 30:
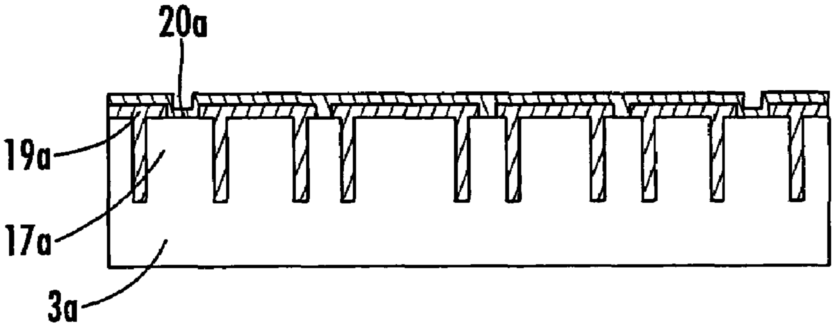
Figure 31:
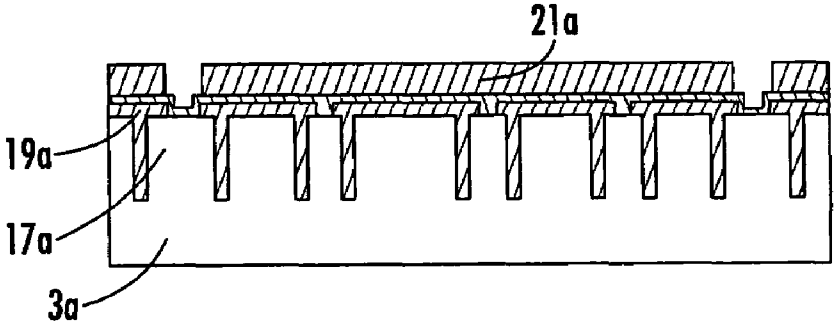
Figure 32:
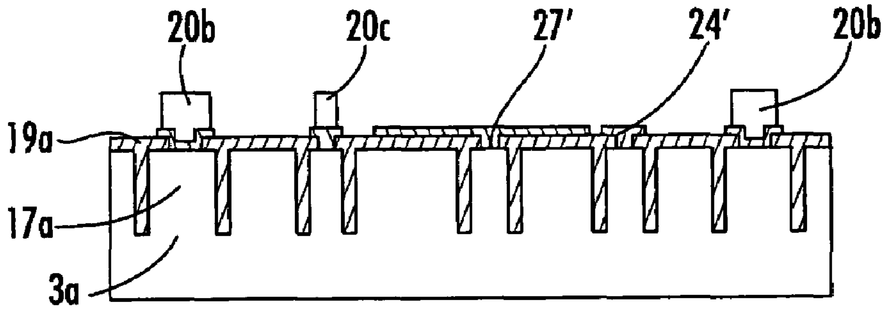

Openings 16*a* are formed through traditional photolithographic techniques and a following etching step in the third layer 11*a* and fourth 13*a* layer to expose the sacrificial aluminum layer 10*a*, to define the geometry of the hanging bar SB and of the frame C. The sacrificial aluminum layer 10*a* is then removed by wet etching. In this embodiment the frame C comprises a silicon dioxide column filled in with metal. Nothing prevents that this column is formed by staggered layers as shown in FIG. 28.

With reference to FIGS. 29 to 32, the process steps to manufacture a substrate 3*a* called the HANDLE are described, when the frame C comprises on the top a metal layer, in particular a gold layer. Highly doped conductive tracks 17*a* are manufactured on a highly resistive silicon substrate 3*a*, for example 3–20 kΩcm, through openings 18 in the substrate 3 and following doping. Openings 18*a* are then oxidized to electrically insulate conductive tracks 17*a*.

A dielectric layer 19*a* is formed on the so-prepared substrate 3*a*. For example a low pressure silicon dioxide layer 19 is deposited, to have electrical insulation between the electrodes to be implemented for controlling the switch and for transmission lines. The 2–3 μm-thick silicon dioxide layer 19*a* is masked and removed in correspondence with the conductive through tracks 17*a* of the frame C and of the possible anchor pad of bar SB. At this point a metal layer 20*a* is formed. Advantageously the formation of this metal layer 20*a* is performed by depositing a gold seed layer with a thickness of a few hundred nanometers.

A mold 21*a* is defined on this metal layer 20*a* for the gold galvanic growth only near the frame C and the switch operation pad 5' on the DEVICE wafer. The gold layer 20*a* is grown for an overall thickness of 3 um. After removing the mold 21*a*, the gold germ is etched to electrically insulate the starting 27*a* and signal transmission 24*b* electrodes and manufacture spacers 20*b* and 20*c*.

Figure 33:
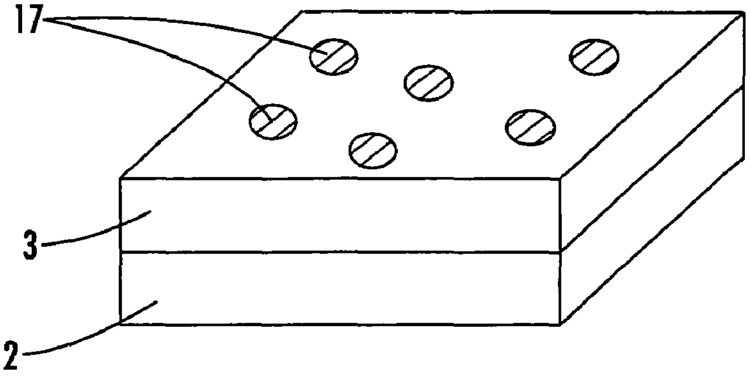
FIG. 33 is a schematic perspective view of a microelectromechanical switch assembled with the method according to the invention.

The method according to the invention continues, for both embodiments, with an assembly step of the two substrates 2, 3. In particular, the welding of the two substrates 2, 3 is performed through a metal layer comprising titanium and palladium or aluminum. The two substrates are aligned through the flip-chip technique, allowing the correct assembly thereof. To form the electric connection with the outside, the HANDLE wafer substrate is milled to expose the oxide filled openings of conductive through tracks 17*a*, as shown in FIG. 33.

Figure 34:
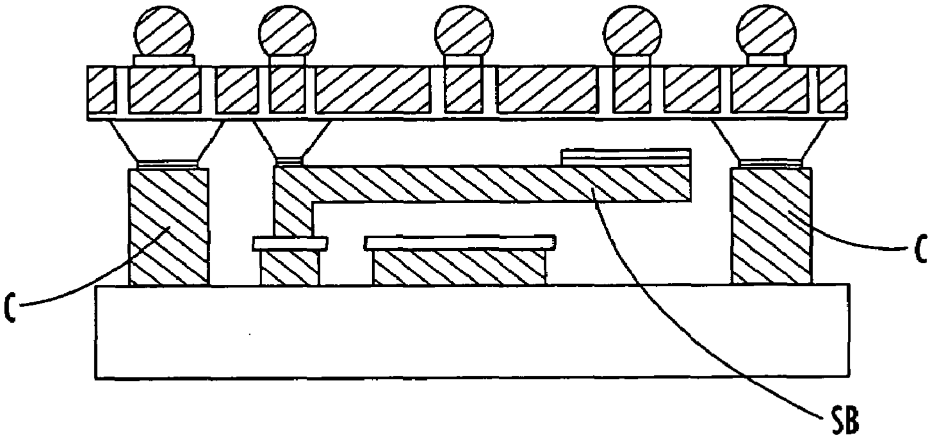
FIG. 34 is a schematic sectional view of the microelectromechanical switch of FIG. 4 at the end of the assembly process.

A layer of wettable material is defined through masking on the back of the HANDLE wafer substrate, and is necessary to let the welding material adhere to fix the chip to the pre-printed board or to another chip. The welding material, which can be lead-tin or silver-tin, is deposited by screen printing, as shown in FIG. 34.

In conclusion, the method according to the invention allows a structure with the following advantages to be manufactured: low dissipated power since it is operated only in the ON state (considerable energy saving); low Insertion Loss (low signal attenuation) which is directly connected to the power amplifier performance, with a low signal attenuation also the amplifier gain must not be high; high Isolation (insulation) where the signal in the switch OFF state is considerably attenuated due to the high distance obtained between the two wafers by using spacers; reliability because the structural part is made of polysilicon, a possible fracture would cause an almost immediate switch deterioration avoiding the slow plastic deformation which is typical of metal structural layers.

Also concerning the oxide embodiment: a good mechanical resistance of the bar is obtained since the metal is incorporated in the oxide which insulates and protects; simple process formed by two wafers and no further galvanic growth steps occur on the wafer, but at best only one galvanic growth step on both wafers; a single wafer is used to manufacture the switch, while the other houses all radio frequency components, the process focuses therefore on optimizing in a separate way mechanical and radio frequency aspects; low contact resistance to have a low Insertion Loss since a gold-on-gold contact decreases the interface barrier as well as the resistance of the contact itself; and electrostatic operation with easy integration, low operation voltage and no signal noise and a relatively high switching speed.

Moreover, according to the invention, electrical connections with the outside are formed via through tracks 17 in the substrate 3 thus avoiding the use of metal wire electrical connections, which are not optimized for the radio frequency signal transmission.

Figure 35:
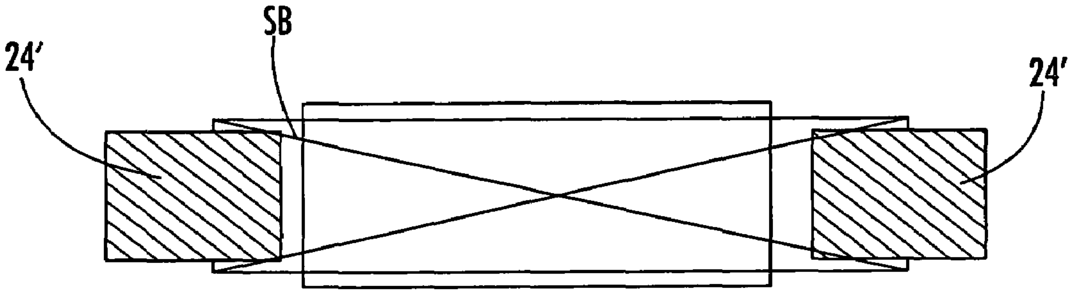
FIG. 35 is a schematic view from above of the microelectromechanical switch according to another embodiment of the invention.

In the present invention specific reference has been made to the manufacture of an ohmic switch in shunt configuration forming a four terminal device. Nothing prevents the manufacture of a switch in series configuration with the process according to the invention. In this embodiment the switch bar SB is a part of the signal line forming a three terminal device, as shown in FIG. 35.

That which is claimed is:

1. A method of manufacturing a micromechanical switch comprising:

providing a bar overhanging a first semiconductor substrate and including a first contact electrode at an end thereof;

providing a first frame projecting from the first semiconductor substrate;

providing a second semiconductor substrate with conductive tracks, a second input/output electrode, a third starting electrode and first peripheral spacers defining a second frame projecting from the second semiconductor substrate and electrically connected to the conductive tracks;

adjoining the first frame against the first peripheral spacers to define a chamber incorporating the bar therein with the first contact electrode in alignment with the second input/output electrode;

providing the second semiconductor substrate with a second insulated central spacer; and adjoining the second insulated central spacer against the bar.

2. A method of manufacturing a micromechanical switch comprising:

providing a bar overhanging a first semiconductor substrate and including a first contact electrode at an end thereof;

providing a first frame projecting from the first semiconductor substrate;

providing a second semiconductor substrate with conductive tracks, a second input/output electrode, a third starting electrode and first peripheral spacers defining a second frame projecting from the second semiconductor substrate and electrically connected to the conductive tracks;

adjoining the first frame against the first peripheral spacers to define a chamber incorporating the bar therein with the first contact electrode in alignment with the second input/output electrode;

providing a first insulating layer on the first semiconductor substrate;

providing an anchor pad on the first insulating layer;

forming a second insulating layer on the first insulating layer;

forming a first opening in the second insulating layer corresponding to the anchor pad;

forming peripheral openings in the first and second insulating layers;

providing a semiconductor material layer over the first and second insulating layers and in the first and peripheral openings;

providing a third insulating layer and a conductive layer on the semiconductor material layer;

forming the first contact electrode in the third insulating layer and conductive layer;

forming the frame and the bar by removing portions of the semiconductor material layer; and removing the second insulating layer.

3. A method of manufacturing a micromechanical switch comprising:

providing a bar overhanging a first semiconductor substrate and including a first contact electrode at an end thereof;

providing a first frame projecting from the first semiconductor substrate;

providing a second semiconductor substrate with conductive tracks, a second input/output electrode, a third starting electrode and first peripheral spacers defining a second frame projecting from the second semiconductor substrate and electrically connected to the conductive tracks;

adjoining the first frame against the first peripheral spacers to define a chamber incorporating the bar therein with the first contact electrode in alignment with the second input/output electrode;

providing a first insulating layer, a second insulating layer and a first conductive layer on the first semiconductor substrate;

forming a third insulating layer and a second conductive layer on the first conductive layer;

forming a fourth starting electrode in the second conductive layer;

depositing a fourth insulating layer over the fourth starting electrode and third insulating layer;

forming the first contact electrode on the fourth insulating layer;

forming the bar in the fourth insulating layer and third insulating layer; and removing the first conductive layer.

4. The method according to claim 3, further comprising forming a contact for the fourth starting electrode.

5. The method according to claim 3, further comprising:

forming openings in the fourth insulating layer and third insulating layer corresponding to the frame; and forming a metal core in the frame.

6. The method according to claim 1, wherein the first and second semiconductor substrates are made of highresistivity silicon.

7. The method according to claim 1, further comprising forming a conductive sealing layer between the frame and the first peripheral spacers.

8. The method according to claim 7, wherein the conductive sealing layer comprises a gold layer.

9. The method according to claim 7, wherein the conductive sealing layer comprises a titanium palladium layer.

10. A method of manufacturing a micromechanical switch comprising:

providing a bar overhanging a first semiconductor substrate and including a first contact electrode at an end thereof;

providing a first frame projecting from the first semiconductor substrate;

providing a second semiconductor substrate with conductive tracks, a second input/output electrode, a third starting electrode and first peripheral spacers defining a second frame projecting from the second semiconductor substrate and electrically connected to the conductive tracks;

adjoining the first frame against the first peripheral spacers to define a chamber incorporating the bar therein with the first contact electrode in alignment with the second input/output electrode;

forming a return electrode on the first semiconductor substrate.

* * * * *